United States Patent [19]

Sosin

[11] 4,044,314
[45] Aug. 23, 1977

[54] FREQUENCY SYNTHESIZERS

[75] Inventor: Boleslaw Marian Sosin, Chelmsford, England

[73] Assignee: The Marconi Company Limited, England

[21] Appl. No.: 276,094

[22] Filed: July 28, 1972

[30] Foreign Application Priority Data

Sept. 28, 1971 United Kingdom .............. 45024/71

[51] Int. Cl.² ............................................ H03B 3/04
[52] U.S. Cl. ..................................... 331/1 A; 331/10; 331/14; 331/16
[58] Field of Search ...................... 331/1 A, 10, 14, 16

[56] References Cited

U.S. PATENT DOCUMENTS

| 3,383,619 | 5/1968 | Naubereit et al. | 331/16 |
| 3,538,450 | 11/1970 | Andrea et al. | 331/10 |
| 3,651,422 | 3/1972 | Underhill | 331/14 |
| 3,689,849 | 9/1972 | Swanson | 331/16 |
| 3,710,274 | 1/1973 | Basse et al. | 331/16 |

Primary Examiner—John Kominski
Attorney, Agent, or Firm—Diller, Brown, Ramik & Wight

[57] ABSTRACT

A frequency synthesizer in which the frequency of a variable frequency oscillator is controlled by means of a control signal and wherein means are provided for determining whether any frequency variation results from a drift in the frequency of the variable frequency oscillator means being provided for generating and maintaining an additional drift control signal to compensate for such drift. The drift control signal is inhibited from change either when it is detected that the control signal is in excess of that which would result solely from drift or the control signal is representative only of a quantisation error.

18 Claims, 1 Drawing Figure

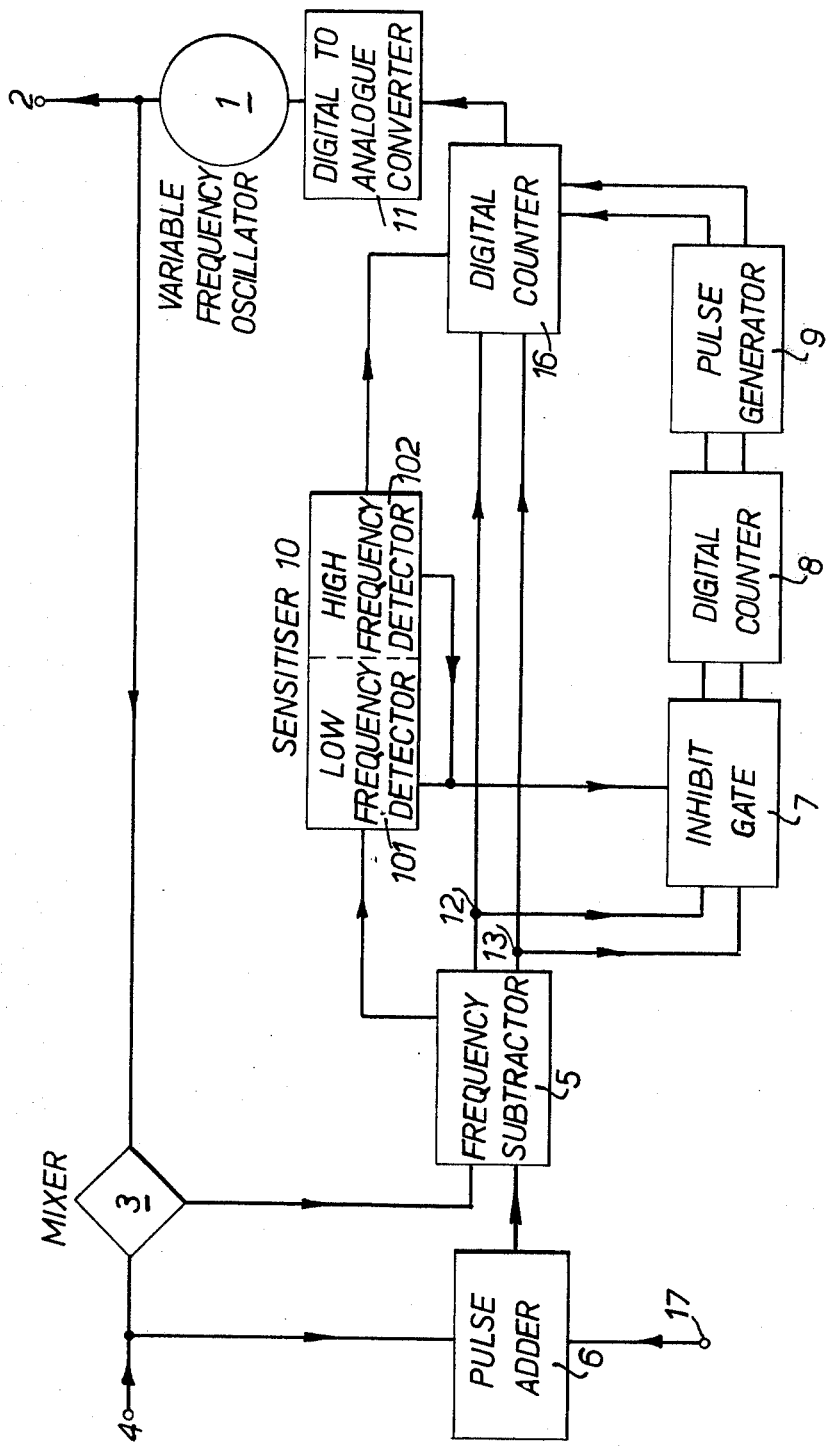

FREQUENCY SYNTHESIZERS

This invention relates to frequency synthesizers in which a variable frequency oscillator is used to provide a particular desired frequency. Frequency synthesizers are known in which an accurately known stable frequency is mixed with the output of a variable frequency oscillator and the mixed frequency compared with a pulse train which is derived from the known stable frequency and which represents a correct mixed frequency. If as a result of the comparison process the mixed frequency and that of the pulse train are not equal a correction signal is applied to the variable frequency oscillator. Systems of this kind depend on the high stability of the variable frequency oscillator since the rate of control and correction when the oscillator frequency is nearly correct is very low because of the necessary long time of measurement of the error. Where the variable frequency oscillator is not perfectly stable, but is subject to a certain drift in frequency, this drift although very small may remain uncorrected for a ralatively long period, i.e. if the drift rate is 1Hz, the delay in correction could be about one second, and this is undesirable where the performance specification for a frequency synthesizer is particularly stringent.

The present invention seeks to provide an improved frequency synthesizer.

According to this invention a frequency synthesizer includes a variable frequency oscillator and means for deriving a first control signal representative of a departure of the output frequency of the frequency synthesizer from a desired output frequency; means for determining whether the first control signal results from a drift in the frequency of the variable frequency oscillator; and means for generating and maintaining an additional drift control signal to compensate for such drift.

The first control signal may of course merely be present because the output frequency of the frequency synthesizer is deliberately altered to a different frequency. In this case the said first control signal is not representative of the drift inherent in the variable frequency oscillator, and preferably first detection means are provided for detecting when the said first control signal is in excess of that which would result solely from drift, and means are provided for inhibiting a consequent alteration in the said drift control signal.

In general however closely the drift in output frequency is compensated for, where the frequency of the variable frequency oscillator is variable in discrete steps however small, inevitably a first control signal is produced which includes a component due to the quantisation error resulting therefrom. Preferably second detection means are provided for detecting a first control signal representative only of a quantisation error, and means are provided for inhibiting a consequent alteration in the said drift control signal.

Preferably the output of the variable frequency oscillator is mixed with the output frequency of a highly stable oscillator, comparison means are provided for comparing the mixed frequency with a pulse train which is derived from the known stable frequency and which represents a correct mixed frequency, said comparison means comprising a frequency subtractor having an output at which is supplied a first control signal when said mixed frequency is greater than that of the said derived pulse train, and having another output at which is supplied a first control signal when said mixed frequency is less than that of the said desired pulse train, in each case the said first control signal consisting of a pulse train having a frequency equal to a small multiple of the difference between the said mixed frequency and that of the said derived pulse train. Usually the small multiple is unity.

The said first control signal is used to control the frequency of the variable frequency oscillator. Preferably again the said first control signal is used to control a pulse generator which produces a stream of pulses which constitute the said drift control signal. Preferably said pulse generator is preceded by a digital counter which maintains control of said pulse generator when said first control signal is removed.

Preferably the means for inhibiting alteration of the said drift control signal comprises a controllable gate interposed between said frequency subtractor and said digital counter.

Preferably the first and second detection means comprises a high frequency detector and a low frequency detector respectively, both detection means being able to control said inhibiting means.

The invention is further described by way of example with reference to the accompanying drawing.

Referring to the drawing there is shown therein a variable frequency oscillator 1 which feeds a desired output frequency to an output terminal 2, and also to one terminal of a mixer 3. An accurately known and stable reference frequency is applied to another terminal of the mixer 3 via an input terminal 4. The difference frequency produced by the mixer is applied to one terminal of a frequency subtractor 5. The reference frequency is also applied to a pulse adder 6, which under control of a signal applied to a terminal 17 derives an output signal consisting of a train of pulses which is applied to a second terminal of the frequency subtractor 5. Frequency subtractor 5 is provided with a pair of output terminals 12 and 13 which are connected both to a reversible digital counter 16 and to an inhibit gate 7. Inhibit gate 7 is connected to a further reversible digital counter 8 which is in turn connected to a pulse generator 9. Pulse generator 9 provides a pair of outputs to the digital counter 16. The frequency subtractor 5 is also connected to a sensitiser 10 having a low frequency detector 101 and a high frequency detector 102. Both the low and high frequency detectors 101 and 102 are connected to a controlling input of the inhibit gate 7, and the sensitiser 10 is also connected to the digital counter 16. Digital counter 16 is connected to the variable frequency oscillator 1 via a digital to analogue converter 11.

The frequency synthesiser operates as follows. The pulse adder 6 receives the reference frequency and converts each cycle thereof to a digital pulse. The control signal present at terminal 17 selects certain of these digital pulses and assembles them into a digital pulse train which is fed to the frequency subtractor. In practice the pulse train will consist of an irregular sequency of pulses which has an effective frequency (i.e. the number of pulses in each second) equal to that frequency which is present at the output of the mixer 3 when the variable frequency oscillator is providing an exactly correct output frequency. A pulse adder of this kind is described fully in our British Patent Specification No. 1,085,866. When the variable frequency oscillator is providing an exactly correct output, no output control signal is provided by the frequency subtractor. If however the output frequency increases a control signal is provided at terminal 12 of the frequency subtractor 5, and conversely if the output frequency decreases a control signal is provided at terminal 13. The frequency subtractor 5 could be of the kind shown in my co-pending U.S. Application No. 268,857, filed July 3, 1972. This kind of frequency subtractor provides control signals at one of the terminals 12 or 13 when there is a difference between the output frequencies of the mixer 3 and the pulse adder 6. These control signals are in the form of pulse trains whose prf are dependent upon the magnitude of this difference, and the sign of the difference determines which of the terminals 12 or 13 produces the output. The control signals are passed to the digital counter 16, which modify the contents of the counter and a correction signal is provided via the digital to analogue converter 11 to the variable frequency oscillator 1. Thus the frequency of the variable frequency oscillator 1 is maintained nominally at its desired value. However, the frequency of the variable frequency oscillator invariably drifts to a greater or lesser extent, and because a variable frequency oscillator would be used which is as stable as possible the rate of drift would be very low. Where the rate of the drift is very low a relatively long waiting period is required before the error has a sufficiently large magnitude as to permit it to be detected by the frequency subtractor 5 and thus to change the level of the control signal applied from the converter 11. To appreciate this action, consider the initial condition in which the oscillator 1 is at the desired frequency but exhibits a drift rate which is exactly compensated by the setting of the counter 8 and consequent pulse output from the pulse generator 9 to the counter 16. So long as this condition prevails, no output will be present from the subtractor on either line 12 or 13. Now assume that the drift rate of the oscillator 1 changes such that the setting of the counter 8 no longer compensates it. Eventually, a pulse output train will appear at either the line 12 or the line 13 dependent upon the direction of the drift rate change. The pulses of this train will step the counter 16 and will also step the counter 8. Thus, the control signal from the converter 11 is changed and at the same time a new setting of the drift rate compensating counter 8 is effected. For this operation, the purpose and function of the gate 7 and of its controls 101 and 102 can be ignored because it is assumed that the prf of the pulse train caused by the drift rate change is low enough on the one hand to pass all pulses of the train and, on the other hand, to be ineffective to actuate the detector 102. The functions of the two detectors 101 and 102 and the associated gate are described hereinafter. Thus pulse generator 9 provides a drift control signal which is representative of the rate of drift. The control signals produced by the frequency subtractor 5 are passed via the inhibit gate 7 (assumed open) to the digital counter 8. When the variable frequency oscillator has been set correctly any control signal in general is representative of the drift. The digital counter 8 counts the incoming pulses in the control signal applied to it and adopts a count which causes pulse generator 9 to provide a drift control signal consisting of a pulse train having a frequency equal to the count in the digital counter 8. These pulses continuously modify the contents of the digital counter 16 to provide compensation for the drift in the variable frequency oscillator. When this drift is compensated for no control signal will of course be present on either of terminals 12 or 13, but the setting of the digital counter 8 ensures that the drift control signal is maintained. If the drift rate should alter slightly, a pulse will be received at one of terminals 12 or 13, the contents of the digital counter 16 will be modified to compensate the frequency error detected and the contents of the digital counter 8 will be modified by counting up or down as required to alter the drift control signal to compensate for the predicted drift.

Sensitiser 10 ensures that only control signals representative of a drift error are passed to digital counter 8. When the output frequency of the frequency synthesiser is changed, the signals applied to the pulse adder 6 via terminal 17 cause a stream of control signal pulses to appear at one of terminals 12 or 13 which causes the required alteration of the contents of the digital counter 16, which in turn causes the variable frequency oscillator to alter its output frequency to the correct value. The high frequency detector 102 detects this high frequency at one of terminals 12 or 13 and generates a signal which closes the inhibit gate 7 before the contents of the digital counter 8 is significantly altered. The high frequency detector could take many forms, and could for example consist of a frequency subtractor similar to frequency subtractor 5 to one input of which is applied a clock signal at a desired high frequency threshold frequency. In this way the drift rate information in digital counter 8 remains essentially unmodified, and as the variable frequency oscillator approaches its new frequency value, the drift rate compensation process recommences with a minimum of disturbance. Were the inhibit gate 7 not provided a large drift control signal would be generated by pulse generator 9 and a certain amount of temporary instability may result in the output frequency.

However accurately the drift in the output frequency may be compensated, because of the digital nature of the control signals a quantisation error, although very small, will invariably be present. Thus even when the drift ate has been reduced to as near zero as the system permits there will still be an occasional control signal pulse produced at one of terminals 12 or 13, and this produces the required small correction in the digital counter 16. The control signal at terminal 12 or 13 would, if permitted, also modify the contents of the digital counter 8, but since the drift rate is already as near zero as it is possible to achieve, this is not desired. In fact if it were permitted a certain amount of instability in the output frequency would result, and this is clearly most undesirable. Therefore the low frequency detector 101 is provided. When a relatively long interval has elapsed, say two or three seconds and no control signal has been produced on either of terminals 12 or 13, the low frequency detector 101 produces a signal which closes inhibit gate 7. When the next pulse of the control signal is produced at one of terminals 12 or 13 it is therefore prevented from reaching the digital counter 8. The pulse is however detected by the low frequency detector 101 and the inhibit gate 7 subsequently opened. If a further control pulse does not occur within the relatively long interval the process is repeated. It will be appreciated that the low frequency detector could consist simply of a resettable monostable having a period of about two or three seconds. Because of the use of drift rate correction it is possible to replace the digital counter 16 and the digital to analogue converter 11 by a capacity storage element having suitable charge and discharge circuits. In this case the pulse generator 9 would become a digital to analogue converter. It is well known that a capacitor store is not perfect and a small discharge of the capacitor due to leakage current would normally add an additional drift to the variable frequency oscillator 1. This would, of course, be automatically compensated by the drift rate control. This modified arrangement should lead to economy in construction, but does not differ in principle from that already described.

I claim:

1. A frequency synthesizer including a variable frequency oscillator; comparison means for deriving a first control signal representative of a departure of the output frequency of the frequency synthesizer from a desired output frequency; control means dependent on said first control signal for controlling said variable frequency oscillator to reduce said departure; means for determining whether the first control signal results from a drift in the frequency of the variable frequency oscillator; means for generating a second control signal representative of the rate of said drift to compensate for such drift and for maintaining said second control signal until a change in the rate of said drift occurs.

2. A frequency synthesiser as claim in claim 1 wherein first detection means are provided for detecting when the said first control signal is in excess of that which would result solely from drift, and means are provided for inhibiting a consequent alteration in the said drift control signal.

3. A frequency synthesiser as claimed in claim 1 wherein second detection means are provided for detecting a first control signal representative only of a quantisation error, and means are provided for inhibiting a consequent alteration in the said drift control signal.

4. A frequency synthesiser as claimed in claim 1 wherein the output of the variable frequency oscillator is mixed with the output frequency of a highly stable oscillator, comparison means are provided for comparing the mixed frequency with a pulse train which is derived from the known stable frequency and which represents a correct mixed frequency, said comparison means comprising a frequency subtractor having an output at which is supplied a first control signal when said mixed frequency is greater than that of the said derived pulse train, and having another output at which is supplied a first control signal when said mixed frequency is less than that of the said desired pulse train, in each case the said first control signal consisting of a pulse train having a frequency equal to a small multiple of the difference between the said mixed frequency and that of the said derived pulse train.

5. A frequency synthesiser as claimed in claim 4 wherein the said first control signal is used to control a pulse generator which produces a stream of pulses which constitute the said drift control signal.

6. A frequency synthesiser as claimed in claim 5 wherein said pulse generator is preceded by a digital counter which maintains control of said pulse generator when said first control signal is removed.

7. A frequency synthesiser as claimed in claim 6 wherein the means for inhibiting alteration of the said drift control signal comprises a controllable gate interposed between said frequency subtractor and said digital counter.

8. A frequency synthesiser as claimed in claim 7 wherein the first and second detection means comprises a high frequency detector and a low frequency detector respectively, both detection means being able to control said inhibiting means.

9. A frequency synthesiser comprising, in combination:
variable frequency oscillator means for producing an output signal whose frequency is adjustable to a desired value;
comparison means connected to the output of said variable frequency oscillator means for producing mutually exclusive first and second output signals in response respectively to deviation of the frequency output of said oscillator means on either side of said desired value;
first storage means connected to the first and second output signals of said comparison means for producing an output control signal whose magnitude is varied in accord with the presence and absence of said first and second output signals of said comparison means; and
second storage means connected to the first and second output signals of said comparison means for producing mutually exclusive first and second output signals in response respectively to rates of change of deviation in the output frequency of said oscillator means on either side of said desired value;
said variable frequency oscillator means being connected to said first and second output signals of said first storage means and to said first and second output signals of said second storage means for frequency control of its output thereby.

10. A frequency synthesiser as defined in claim 9 wherein each of said first and second output signals of the first storage means is in the form of a pulse train whose prf is dependent upon the magnitude of the frequency deviation of the oscillator means from said desired value, and wherein each of said first and second output signals of the second storage means is in the form of a pulse train whose prf is dependent upon the magnitude of frequency deviation rate of the oscillator means.

11. A frequency synthesiser as defined in claim 10 including selective control means connected between said comparison means and the first and second storage means for selectively changing the frequency of said desired value, and said second storage means including means for essentially obviating changes in said first and second output signals thereof incident to large rates of frequency deviation of said oscillator means effected by said selective control means.

12. A frequency synthesiser as defined in claim 9 including selective control means connected between said comparison means and the first and second storage means for selectively changing the frequency of said desired value, and said second storage means including means for essentially obviating changes in said first and second output signals thereof incident to large rates of frequency deviation of said oscillator means effected by said selective control means.

13. A frequency synthesiser as defined in claim 9 including means for inhibiting input to said second storage means in response to frequency deviation rate of said oscillator means which exceeds a predetermined value.

14. A frequency synthesiser comprising, in combination:
variable frequency oscillator means for producing an output signal whose frequency is of a desired value;
comparison means connected to said output signal for producing pulse train signals representing the magnitude and direction of frequency deviations of said output signal from the desired value;

storage means connected to said pulse train signals for producing a control signal controlling said oscillator means to reduce said frequency deviations thereof, said storage means including a first portion responsive to the magnitude of said frequency deviations and a second portion responsive to the rate of said frequency deviations.

15. A frequency synthesiser as defined in claim 14 including means for inhibiting said second portion in response to a rate of frequency deviation exceeding a predetermined value.

16. A frequency synthesiser as defined in claim 15 including means for selectively controlling said comparison means to alter said desired value of the frequency of said output signal.

17. A frequency synthesiser comprising in combination:
   variable frequency oscillator means for producing an output signal of desired frequency;
   comparison means connected to said output signal for intermittently producing a first control signal representative of a departure of said output signal from said desired frequency;
   control means connected to said first control signal and to said oscillator means for intermittently reducing said departure in consonance with the intermittent appearance of said first control signal; and
   drift control means connected between said first control signal and said oscillator means for producing a continuing drift control signal reducing said departure and whose magnitude is dependent upon the intermittent nature of said first control signal.

18. A frequency synthesiser as defined in claim 17 wherein said drift control means includes means for inhibiting input thereto from said comparison means in response to frequency departures which exceed a predetermined rate whereby to retain the drift characteristic of said oscillator means irrespective of rapid rates of frequency excursion which may be imposed thereon.

* * * * *